United States Patent
Chen et al.

(10) Patent No.: US 7,160,811 B2
(45) Date of Patent: Jan. 9, 2007

(54) LAMINATED SILICATE GLASS LAYER ETCH STOP METHOD FOR FABRICATING MICROELECTRONIC PRODUCT

(75) Inventors: Yen-Ming Chen, Hsin-Chu (TW); Huan-Chi Tseng, Hsin-Chu (TW); Yu-Hua Lee, Hsinchu (TW); Dian-Hau Chen, Hsinchu (TW); Chia-Hung Lai, Taichung (TW); Kang-Min Kuo, Hsin-chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 146 days.

(21) Appl. No.: 10/278,968

(22) Filed: Oct. 22, 2002

(65) Prior Publication Data

US 2004/0074872 A1  Apr. 22, 2004

(51) Int. Cl.
*H01L 21/302* (2006.01)
(52) U.S. Cl. .................. 438/706; 438/723; 438/745
(58) Field of Classification Search ................ 438/706, 438/723, 724, 689, 704, 745, 756
See application file for complete search history.

(56) References Cited

U.S. PATENT DOCUMENTS

| 5,550,082 | A | * | 8/1996 | Wolfe et al. | 438/567 |
| 5,728,618 | A | * | 3/1998 | Tseng | 438/253 |
| 5,817,580 | A | * | 10/1998 | Violette | 438/756 |
| 5,869,396 | A | * | 2/1999 | Pan et al. | 438/647 |
| 6,025,267 | A | * | 2/2000 | Pey et al. | 438/656 |
| 6,187,655 | B1 | | 2/2001 | Wang et al. | |
| 6,303,447 | B1 | * | 10/2001 | Chhagan et al. | 438/299 |
| 6,348,389 | B1 | | 2/2002 | Chou et al. | |
| 6,530,380 | B1 | * | 3/2003 | Zhou et al. | 134/1.2 |

OTHER PUBLICATIONS

Hawley's Condensed Chenical Dictionary, Richard J. Lewis, Sr., Thirteenth edition, p. 589.*
S. Wolf "Silicon Processing for the VLSI Era", vol. 1. 1986, pp. 532-533.*

* cited by examiner

*Primary Examiner*—Kin-Chan Chen
(74) *Attorney, Agent, or Firm*—Tung & Associates

(57) ABSTRACT

A method for fabricating a microelectronic fabrication employs an undoped silicate glass layer as an etch stop layer when etching a doped silicate glass layer with an anhydrous hydrofluoric acid etchant. The method is particularly useful for forming a patterned salicide blocking dielectric layer when fabricating a complementary metal oxide semiconductor device.

19 Claims, 3 Drawing Sheets

LAMINATED SILICATE GLASS LAYER ETCH STOP METHOD FOR FABRICATING MICROELECTRONIC PRODUCT

BACKGROUND OF THE INVENTION

1. Field of the Invention

The present invention relates generally to methods for fabricating microelectronic products. More particularly, the present invention relates to etch stop layers and etch stop methods for fabricating microelectronic products.

2. Description of the Related Art

Common in the art of semiconductor product fabrication is the use of complementary metal oxide semiconductor (CMOS) devices formed within and upon semiconductor substrates. CMOS devices, such as CMOS field effect transistor (FET) devices, are generally of interest within semiconductor products insofar as CMOS devices may often be readily fabricated to provide low power consumption circuits within semiconductor products.

While CMOS devices are thus clearly desirable and often essential in the art of semiconductor product fabrication, CMOS devices are nonetheless not entirely without problems.

In that regard, it is often difficult in the art of semiconductor product fabrication to fabricate CMOS devices with enhanced performance.

It is towards the foregoing object that the present invention is directed.

Various methods have been disclosed in the art of semiconductor product fabrication for fabricating CMOS devices with desirable properties.

Included among the methods, but not limiting among the methods are methods disclosed within: (1) Wang et al., in U.S. Pat. No. 6,187,655 (a pre-amorphizing implant (PAI) method for forming CMOS devices with reduced resist protect oxide (RPO) layer damage and reduced junction leakage); and (2) Chou et al., in U.S. Pat. No. 6,348,389 (an RPO etch method with enhanced endpoint detection for use when fabricating CMOS devices).

Desirable in the art of semiconductor product fabrication are additional methods for fabricating CMOS devices with enhanced performance.

It is towards the foregoing object that the present invention is directed.

SUMMARY OF THE INVENTION

A first object of the present invention is to provide a method for fabricating a CMOS device.

A second object of the present invention is to provide a method in accord with the first object of the invention, wherein the CMOS device is fabricated with enhanced performance.

In accord with the objects of the present invention, the present invention provides a method for fabricating a microelectronic product.

To practice the method of the present invention, there is first provided a substrate. There is then formed over the substrate an undoped silicate glass layer. There is then formed upon the undoped silicate glass layer a doped silicate glass layer. Finally, there is then etched from the undoped silicate glass layer the doped silicate glass layer while employing an anhydrous hydrofluoric acid etchant.

Within the present invention, the undoped silicate glass layer serves as an etch stop layer when etching from the undoped silicate glass layer the doped silicate glass layer while employing the anhydrous hydrofluoric acid etchant.

The invention provides a method for fabricating a CMOS device, wherein the CMOS device is fabricated with enhanced performance.

The invention realizes the foregoing object by employing when fabricating the CMOS device an undoped silicate glass layer/doped silicate glass layer laminate structure where the undoped silicate glass layer serves as an etch stop layer for etching the doped silicate glass layer within an anhydrous hydrofluoric acid etchant. As will be illustrated in greater detail within the Description of the Preferred Embodiment, such a silicate glass laminated structure provides for enhanced performance of a CMOS device fabricated within a semiconductor product since the presence of the undoped silicate glass layer as an etch stop layer provides for enhanced process latitude and attenuated overetching when forming the CMOS device within the semiconductor product.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method for fabricating a CMOS device, wherein the CMOS device is fabricated with enhanced performance.

The invention realizes the foregoing object by employing when fabricating the CMOS device an undoped silicate glass layer/doped silicate glass layer laminate structure where the undoped silicate glass layer serves as an etch stop layer for etching the doped silicate glass layer within an anhydrous hydrofluoric acid etchant. As will be illustrated in greater detail, such a laminated layer structure provides for enhanced performance of a CMOS device fabricated within a semiconductor substrate since the presence of the undoped silicate glass layer as an etch stop layer provides for enhanced process latitude and attenuated overetching when forming the CMOS device within the semiconductor product.

While the present invention provides particular value within the context of fabricating CMOS devices, the present invention is not intended to be so limited. Thus, FIG. 1 to FIG. 4 show a series of schematic cross-sectional diagrams illustrating the results of progressive stages of fabricating a microelectronic product in accord with a general embodiment of the invention.

Figure 1:
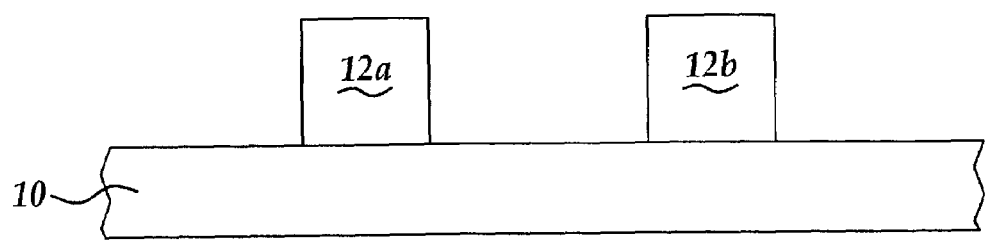
FIG. 1, FIG. 2, FIG. 3 and FIG. 4 show a series of schematic cross-sectional diagrams illustrating the results of progressive stages of fabricating a microelectronic product in accord with a general embodiment of the invention.

Shown in FIG. 1 is a schematic cross-sectional diagram of the microelectronic product at an early stage in its fabrication in accord with the general embodiment of the invention.

FIG. 1 shows a substrate 10 having formed thereupon a pair of optional topographic features 12a and 12b.

Within the invention, the substrate 10 may be employed within a microelectronic product selected from the group including but not limited to integrated circuit products, ceramic substrate products and optoelectronic products. Although not specifically illustrated within the schematic cross-sectional diagram of FIG. 1, the substrate 10 may consist of a substrate alone as employed within the microelectronic product. In the alternative, the substrate 10 may comprise a substrate as employed within the microelectronic product, wherein the substrate has formed thereupon and/or thereover additional microelectronic layers as are conventional within the microelectronic product within which is employed the substrate. Similarly with the substrate alone as employed within the microelectronic product, such additional microelectronic layers may be formed from microelectronic materials selected from the group including bit not limited to conductor materials, semiconductor materials and dielectric materials.

Within the invention, the optional pair of topographic features 12a and 12b may be formed of microelectronic materials as are conventional in the art of microelectronic fabrication, including but not limited to conductor materials, semiconductor materials and dielectric materials. Typically, each of the pair of topographic features 12a and 12b is formed to a thickness of from about 1000 to about 3000 angstroms and a linewidth of from about 0.08 to about 0.25 microns.

Figure 2:
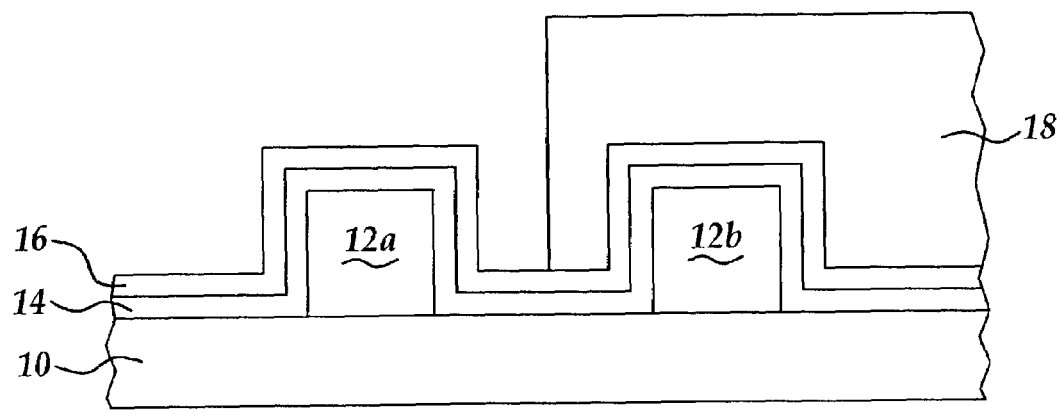

FIG. 2 shows the results of further processing of the microelectronic product of FIG. 1.

FIG. 2 shows the results of forming upon exposed portions of the substrate 10 and the pair of topographic features 12a and 12b a blanket undoped silicate glass layer 14. In turn, the blanket undoped silicate glass layer 14 has formed thereupon a blanket doped silicate glass layer 16. Finally, the blanket doped silicate glass layer 16 in turn has formed thereupon a patterned photoresist layer 18 which covers the topographic feature 12b but not the topographic feature 12a.

Within the invention, the blanket undoped silicate glass layer 14, the blanket doped silicate glass layer 16 and the patterned photoresist layer 18 may be formed employing methods and materials as are conventional in the art of microelectronic fabrication.

Typically, the blanket undoped silicate glass layer 14 is formed to a thickness of from about 80 to about 150 angstroms while employing a chemical vapor deposition (CVD) method, such as a [plasma enhanced chemical vapor deposition (PECVD) method employing silane or tetraethylorthosilicate (TEOS) as a silicon source material, along with an appropriate oxidant. Typically, the blanket doped silicate glass layer 16 is formed to a thickness of from about 200 to about 500 angstroms and also formed employing a chemical vapor deposition (CVD) method. It is doped with a dopant at a concentration of from about 1 to about 8 weight percent. Typical dopants include, but are not limited to boron, phosphorus and boron/phosphorus aggregate dopants.

Finally, the patterned photoresist layer 18 is formed to a thickness of from about 10000 to about 20000 angstroms.

Figure 3:
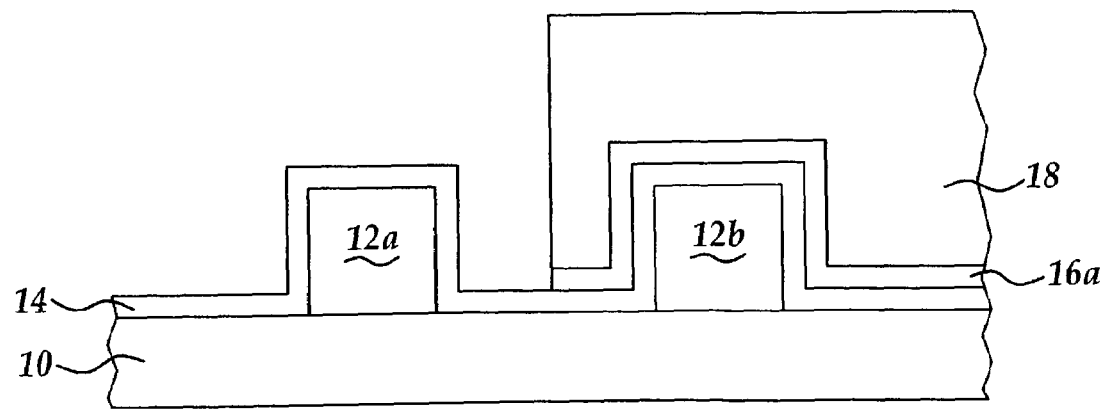

FIG. 3 shows the results of further processing of the microelectronic product of FIG. 2.

FIG. 3 shows the results of etching the blanket doped silicate glass layer 16, while employing the patterned photoresist layer 18 as an etch mask layer, to form a patterned doped silicate glass layer 16a.

Within the invention, the blanket doped silicate glass layer 16 is etched to form the patterned doped silicate glass layer 16a while employing an anhydrous hydrofluoric acid etchant. Under such circumstances, and in accord with the examples which follow, the blanket undoped silicate glass layer 14 serves as an etch stop layer since it may have an etch rate ratio of from about 1:10 to about 1:200 with respect to the blanket doped silicate glass layer 16. Within the present invention, the anhydrous hydrofluoric acid etchant is typically provided as a vaporous anhydrous hydrofluoric acid etchant at a temperature of from about 50 to about 150 degrees centigrade and a flow rate of from about 10 to about 100 standard cubic centimeters per minute (sccm). By employing the anhydrous hydrofluoric acid etchant in conjunction with the undoped silicate glass layer 14 as an etch stop layer, the invention provides for an enhanced process window with respect to overetching when forming the patterned doped silicate glass layer 16a from the blanket doped silicate glass layer 16.

Figure 4:
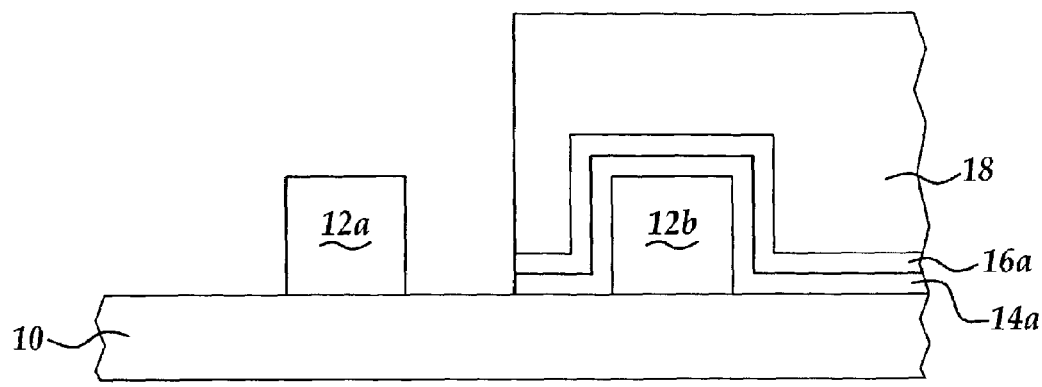

FIG. 4 shows the results of further processing of the microelectronic fabrication of FIG. 3.

FIG. 4 shows the results of further etching the blanket undoped silicate glass layer 14 to form a patterned undoped silicate glass layer 14a while still employing the patterned photoresist layer 18 as an etch mask layer.

Within the invention, the blanket undoped silicate glass layer 14 is etched to form the patterned undoped silicate glass layer 14a while employing an aqueous hydrofluoric acid etchant solution, typically at about 49 weight percent hydrofluoric acid and a temperature of from about 25 to about 75 degrees centigrade.

FIG. 5 to FIG. 9 show a series of schematic cross-sectional diagrams illustrating the results of progressive stages of forming a CMOS device within a semiconductor product in accord with a more specific embodiment of the invention.

Figure 5:
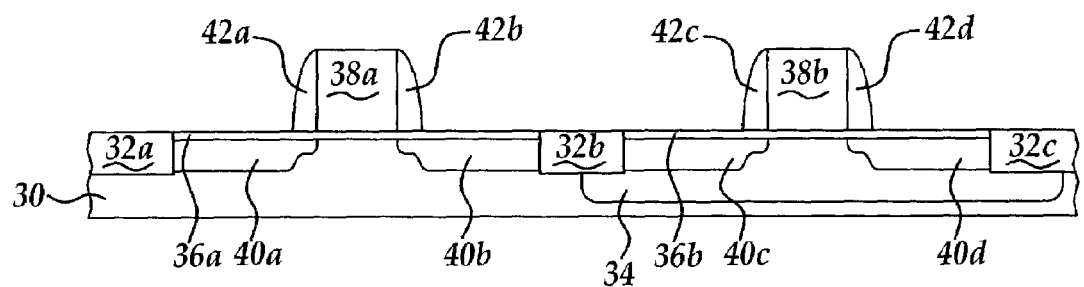
FIG. 5, FIG. 6, FIG. 7, FIG. 8 and FIG. 9 show a series of schematic cross-sectional diagrams illustrating the results of progressive stages of fabricating a CMOS semiconductor product in accord with a more specific embodiment of the invention.

FIG. 5 shows a semiconductor substrate 30 having formed therein a series of isolation regions 32a, 32b and 32c which define a pair of active regions of the semiconductor substrate 30. FIG. 5 also illustrates a counter-doped well 34 which encompasses one of the active regions of the semiconductor substrate 30 but not the other. Within the more specific embodiment of the invention, the semiconductor substrate 30 may be of either dopant polarity, several dopant concentrations and various crystallographic orientations. The counter-doped well 34 is of opposite polarity to the semiconductor substrate 30. In addition, the series of isolation regions 32a, 32b and 32c may be formed employing methods and materials as are conventional in the art of semiconductor product fabrication, to provide the series of isolation regions 32a, 32b and 32c as isolation regions including but not limited to shallow trench isolation regions and local oxidation of silicon (LOCOS) isolation regions.

FIG. 5 also shows formed within and upon the pair of active regions of the semiconductor substrate 30 a pair of field effect transistor devices comprising a pair of gate dielectric layers 36a and 36b formed upon the pair of active regions of the semiconductor substrate 30; (2) a pair of gate electrodes 38a and 38b formed upon the pair of gate dielectric layers 36a and 36b; (3) a series of source/drain regions 40a, 40b, 40c and 40d formed into the active regions of the semiconductor substrate 30 at areas not covered by the pair of gate electrodes 38a and 38b; and (4) a series of spacer layers 42a, 42b, 42c and 42d formed adjoining the pair of gate electrodes 38a and 38b. Each of the foregoing series of structures from which is comprised the pair of field effect transistor devices may be formed employing methods and materials as are conventional in the art of semiconductor product fabrication.

For example, each of the pair of gate dielectric layers 36a and 36b is typically formed upon the corresponding active region of the semiconductor substrate 30 to a thickness of from about 700 to about 750 μm and from a silicon oxide material. In addition, each of the pair of gate electrodes 38a and 38b is typically formed of a polysilicon material formed to a thickness of from about 1500 to about 3500 angstroms and a linewidth of from about 0.08 to about 0.15 angstroms. Further, each of the series of source/drain regions 40a, 40b, 40c and 40d is typically formed employing a two step ion implant method employing a lower ion implant dose absent the series of spacers 42a, 42b, 42c and 42d and a higher ion implant dose in the presence of the series of spacers 42a, 42b, 42c and 42d. Finally, the series of spacers 42a, 42b, 42c and 42d is typically formed at least in part of a silicon nitride containing material.

Figure 6:
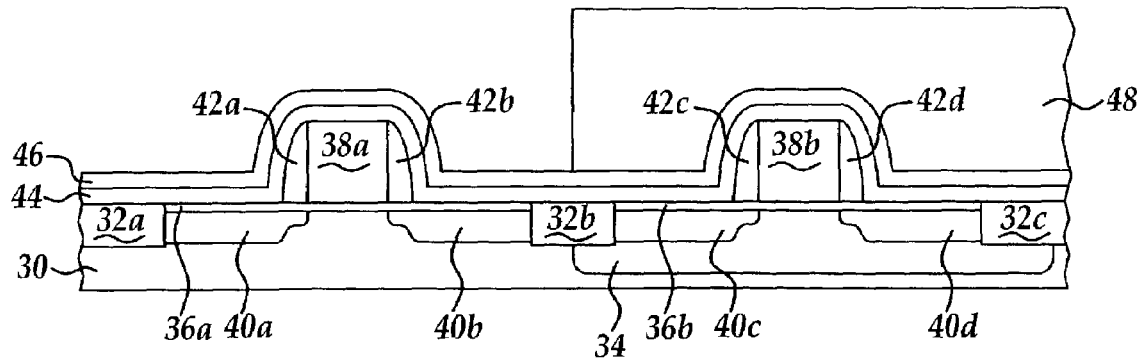

FIG. 6 shows the results of further processing of the semiconductor product of FIG. 5.

FIG. 6 shows the results of forming over the semiconductor substrate 30 and covering each of the pair of field effect transistor devices a blanket undoped silicate glass layer 44 in turn having formed thereupon a blanket doped silicate glass layer 46. Finally, the blanket doped silicate glass layer 46 has formed thereupon a patterned photoresist layer 48 which covers one of the pair of field effect transistor devices but not the other of the pair of field effect transistor devices.

Within FIG. 6, the blanket undoped silicate glass layer 44, the blanket doped silicate glass layer 46 and the patterned photoresist layer 48 may be formed employing methods, materials and dimensions analogous or identical to the methods, materials and dimensions employed for forming the blanket undoped silicate glass layer 14, the blanket doped silicate glass layer 16 and the patterned photoresist layer 18 as illustrated within FIG. 2.

Figure 7:
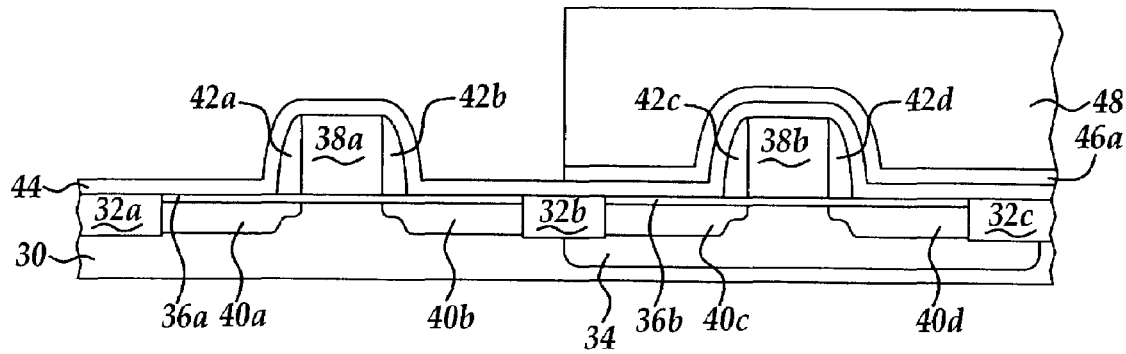

FIG. 7 shows the results of further processing of the semiconductor product of FIG. 6.

FIG. 7 shows the results of etching the blanket doped silicate glass layer 46 to form a patterned doped silicate glass layer 46a while employing the patterned photoresist layer 48 as an etch mask layer and the blanket undoped silicate glass layer 44 as an etch stop layer. Such etching is undertaken while employing an anhydrous hydrofluoric acid etchant, in accord with the general embodiment of the invention as disclosed in greater detail in accord with FIG. 3.

Figure 8:
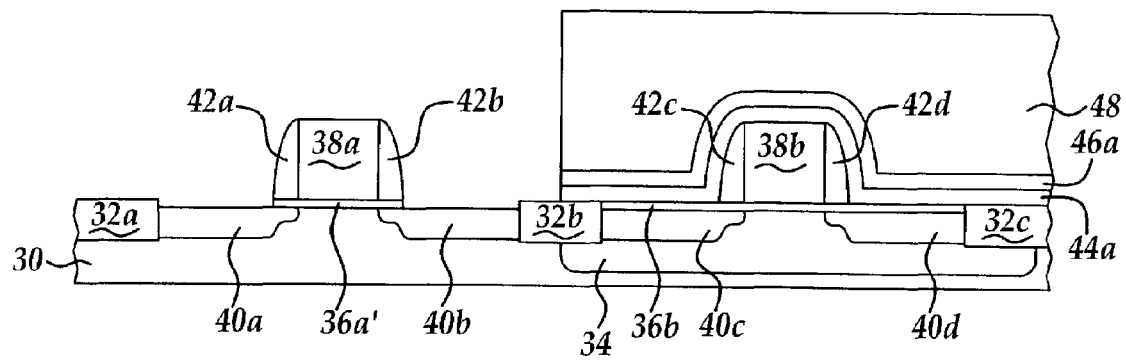

FIG. 8 shows the results of further processing of the semiconductor product of FIG. 7.

FIG. 8 shows the results of patterning the blanket undoped silicate glass layer 44 to form a patterned undoped silicate glass layer 44a while employing the patterned photoresist layer 48 as an etch mask layer. Such patterning may be undertaken employing an aqueous hydrofluoric acid etchant in accord with the general embodiment of the invention as illustrated within FIG. 4.

FIG. 8 also shows the result of patterning the gate dielectric layer 36a to form a patterned gate dielectric layer 36a'. Such patterning may be undertaken while employing the same aqueous hydrofluoric acid etchant as is employed for etching the blanket undoped silicate glass layer 44 when forming therefrom the patterned undoped silicate glass layer 44a.

Figure 9:
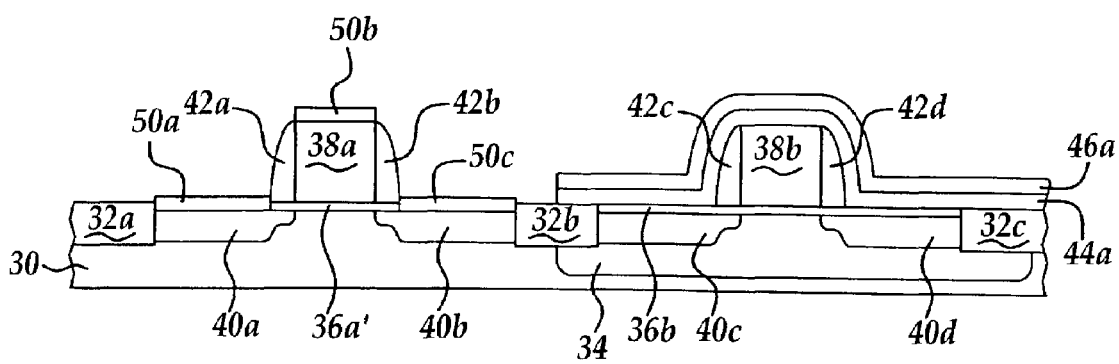

FIG. 9 shows the results of further processing of the semiconductor product of FIG. 8.

FIG. 9 shows the results of stripping the patterned photoresist layer 48 from the patterned doped silicate glass layer 46a. Such stripping may be effected employing stripping methods and materials as are conventional in the art of semiconductor product fabrication. FIG. 9 also shows the results of forming a series of metal silicide layers 50a, 50b and 50c upon exposed portions of the pair of source/drain regions 40a and 40b and the gate electrode 38a. Within the more specific embodiment of the invention, the series of metal silicide layers 50a, 50b and 50c may be formed employing a thermal silicidation method as is conventional in the art of semiconductor fabrication. The series of metal silicide layers 50a, 50b and 50c is typically formed as cobalt silicide layers, although silicides of other metals, such as titanium and nickel, may also be employed.

FIG. 9 illustrates a semiconductor product having formed therein a CMOS device as illustrated within the context of a pair of field effect transistor devices. The CMOS device is formed with enhanced performance insofar as a salicide blocking layer formed upon a portion of the CMOS device is formed as a laminate of an undoped silicate glass layer having formed thereupon a doped silicate glass layer. Within the present invention, the undoped silicate glass layer serves as an etch stop layer when etching the doped silicate glass layer while employing an anhydrous hydrofluoric acid etchant. Thus, the salicide blocking layer may be etched with enhanced precision and attenuated overetching into a semiconductor substrate. In turn, such attenuated overetching into the semiconductor substrate provides for enhanced performance of the CMOS device.

EXAMPLE

Three silicate glass layers of varying phosphorus dopant concentration (zero weight percent, three weight percent and eight weight percent) were formed upon three separate semiconductor substrates. Each of the silicate glass layers was etched within a vaporous anhydrous hydrofluoric acid etchant at a temperature of about 100 degrees centigrade and a flow rate of about 100 standard cubic centimeters per minute (sccm). Etch rates for the three silicate glass layers were determined employing methods as are conventional. Results of the etch rate determinations are reported in Table I.

TABLE I

| Dopant Wt % | Etch Rate (A/min) |
| --- | --- |
| 0 | 1 |
| 3 | 220 |
| 8 | 250 |

The data in Table I clearly indicate that an undoped silicate glass layer serves as an effective etch stop layer with respect to a doped silicate glass layer within an anhydrous hydrofluoric acid etchant, in accord with the invention.

The preferred embodiments and examples of the invention are illustrative of the invention rather than limiting of the invention. Revisions and modifications may be made to structures and dimensions in accord with the preferred embodiments and examples of the invention while still providing a method in accord with the invention, further in accord with the accompanying claims.

What is claimed is:

1. A method for fabricating a microelectronic product to prevent overetching a substrate with anhydrous HF etchant comprising:
    providing a substrate comprising topographic features;
    forming over the topographic features an undoped silicate glass layer;
    forming upon the undoped silicate glass layer a doped silicate glass layer formed employing a deposition method to form a non-planar topography;
    etching from the undoped silicate glass layer the doped silicate glass layer to selectively remove the doped silicate glass layer while employing an anhydrous HF etchant;
    etching the undoped silicate glass layer while employing an aqueous hydrofluoric acid etchant to completely remove the undoped silicate glass layer following said selective removal of the doped silicate glass layer; and,
    forming a metal silicide on said substrate following said complete removal of said undoped silicate glass layer.

2. The method of claim 1 wherein the undoped silicate glass layer serves as an etch stop layer when etching from the undoped silicate glass layer the doped silicate glass layer.

3. The method of claim 1 wherein the substrate is employed within a microelectronic product selected from the group consisting of integrated circuit products, ceramic substrate products and optoelectronic products.

4. The method of claim 1 wherein the anhydrous hydrofluoric acid etchant is a vaporous anhydrous HF etchant.

5. The method of claim 1 wherein:
    the undoped silicate glass layer is formed to a thickness of from about 50 to about 150 angstroms; and
    the doped silicate glass layer is formed to a thickness of from about 200 to about 500 angstroms.

6. The method of claim 1 wherein the doped silicate glass layer is formed from a doped silicate glass material selected from the group consisting of boron, phosphorus and boron/phosphorus doped silicate glass materials.

7. The method of claim 1, wherein the substrate comprises a semiconductor substrate and the topographic features comprise gate electrodes.

8. The method of claim 7, further comprising forming said metal silicide on the gate electrodes.

9. The method of claim 1, wherein said metal silicide is formed on source/drain regions comprising the substrate.

10. The method of claim 1, wherein the patterned doped silicate glass layer and the patterned undoped silicate glass layer form a salicide blocking layer with respect to the substrate.

11. A method for forming a complementary metal oxide semiconductor product comprising:
    providing a semiconductor substrate having formed therein a minimum of two active regions;
    forming upon the minimum of two active regions of the semiconductor substrate a minimum of two semiconductor devices;
    conformably forming covering the semiconductor substrate including the minimum of two semiconductor devices a non-planar composite layer comprising an undoped silicate glass layer having formed thereupon a doped silicate glass layer;
    forming upon the composite layer over one of the minimum of two semiconductor devices but not over a second of the minimum of two semiconductor devices a patterned mask layer;
    etching the doped silicate glass layer to form a patterned doped silicate glass layer with an anhydrous HE etchant and while employing the patterned mask layer as an etch mask layer and the undoped silicate glass layer as an etch stop layer to selectively remove the doped silicate glass layer; and,
    then etching the undoped silicate glass layer with an aqueous hydrofluoric acid etchant to remove the undoped silicate glass layer while employing the patterned photoresist layer as an etch mask layer.

12. The method of claim 11 wherein the anhydrous HF etchant is a vaporous anhydrous HF etchant.

13. The method of claim 11 wherein;
    the undoped silicate glass layer is formed to a thickness of from about 50 to about 150 angstroms; and
    the doped silicate glass layer is formed to a thickness of from about 200 to about 500 angstroms.

14. The method of claim 11 wherein the doped silicate glass layer is formed from a doped silicate glass material selected from the group consisting of boron, phosphorus and boron/phosphorus doped silicate glass materials.

15. The method of claim 11 wherein the patterned doped silicate glass layer and the patterned undoped silicate glass layer form a salicide blocking layer with respect to the semiconductor substrate.

16. The method of claim 11 wherein the doped silicate glass layer is formed employing a deposition method.

17. A method for forming a complementary metal oxide semiconductor product to prevent overetching a semiconductor substrate with anhydrous HF comprising:
    providing a semiconductor substrate having formed therein a minimum of two active regions;
    forming upon the minimum of two active regions of the semiconductor substrate a minimum of two semiconductor devices to form a non-planar topography;
    conformably forming covering the semiconductor substrate including the minimum of two semiconductor devices with a composite layer comprising an undoped silicate glass layer having formed thereupon a doped silicate glass layer to form the composite layer having a non-planar topography;
    forming upon the composite layer over one of the minimum of two semiconductor devices but not over a second of the minimum of two semiconductor devices a patterned mask layer;
    then etching the doped silicate glass layer with an anhydrous HF etchant according to a vapor etch process to selectively remove the doped silicate glass layer over the undoped silicate glass layer while employing the patterned mask layer as an etch mask layer; and,
    then etching the undoped silicate glass layer with an aqueous hydrofluoric acid etchant to remove the undoped silicate glass layer while employing the patterned photoresist layer as an etch mask layer.

18. The method of claim 17 wherein the doped silicate glass layer is thicker than the undoped silicate glass layer.

19. The method of claim 17 wherein the doped silicate glass layer is formed from a doped silicate glass material selected from the group consisting of boron, phosphorus and boron/phosphorus doped silicate glass materials.

* * * * *